United States Patent
Townsend et al.

(10) Patent No.: US 8,593,291 B2
(45) Date of Patent: Nov. 26, 2013

(54) COMPONENT RFID TAG WITH NON-VOLATILE DISPLAY OF COMPONENT USE INCLUDING THE USE OF ENERGY HARVESTING

(75) Inventors: Christopher P. Townsend, Shelburne, VT (US); Jacob Henry Galbreath, Burlington, VT (US); Steven Willard Arms, Shelburne, VT (US)

(73) Assignee: LORD Corporation, Cary, NC (US)

( * ) Notice: Subject to any disclaimer, the term of this patent is extended or adjusted under 35 U.S.C. 154(b) by 556 days.

(21) Appl. No.: 12/782,597

(22) Filed: May 18, 2010

(65) Prior Publication Data
US 2010/0315248 A1    Dec. 16, 2010

Related U.S. Application Data

(60) Provisional application No. 61/179,336, filed on May 18, 2009.

(51) Int. Cl.
*G08B 21/00*    (2006.01)

(52) U.S. Cl.
USPC ............ 340/635; 340/539.1; 340/572.1

(58) Field of Classification Search
USPC ......... 340/539.1, 572.1, 635, 636.1; 310/339; 290/1 R
See application file for complete search history.

(56) References Cited

U.S. PATENT DOCUMENTS

| | | |
|---|---|---|
| 7,081,693 B2 | 7/2006 | Hamel |
| 7,461,560 B2 | 12/2008 | Arms |
| 7,692,365 B2 | 4/2010 | Churchill |
| 7,719,416 B2 | 5/2010 | Arms |
| 2001/0054317 A1 | 12/2001 | Arms |
| 2002/0167500 A1 | 11/2002 | Gelbman |
| 2006/0213278 A1 | 9/2006 | Arms |
| 2007/0285229 A1 | 12/2007 | Batra |
| 2008/0036617 A1 | 2/2008 | Arms |
| 2008/0303637 A1 | 12/2008 | Gelbman |
| 2010/0088051 A1* | 4/2010 | Iwai et al. ................ 702/63 |

OTHER PUBLICATIONS

Overview of USN Structural Life Management, Naval Air Systems Command, Aircraft Structural Life Surveillance Branch, p. 17-18.
Google Introduces Physical World Hyperlinks to the U.S. http://www.centernetworks.com/google-qr-codes-print-advertising.
QR Code features http://www.denso-wave.com/qrcode/qrfeature-e.html.
Barcode From Wikipedia http://en.wikipedia.org/wiki/Barcode#2D_barcodes.
Data Matrix http://en.wikipedia.org/wiki/Data_Matrix#cite_note-1.
E Ink Display Products http://www.eink.com/.

(Continued)

*Primary Examiner* — Jeffery Hofsass
(74) *Attorney, Agent, or Firm* — James Marc Leas; Richard G. Miller

(57) ABSTRACT

A system includes a component, an electronic circuit, and a display. The electronic circuit and the display are on the component. The electronic circuit is connected to receive data related to use of the component. The electronic circuit is connected to the display for providing a time parameter related to at least one from the group consisting of remaining life of the component and life expended by the component. The time parameter is for displaying on the display.

46 Claims, 10 Drawing Sheets

(56) References Cited

OTHER PUBLICATIONS

N. Iyyer, et. al "Architecture for Dynamic Component Life Tracking in an Advanced HUMS, RFID and Direct Load Sensor Environment", Sixth DSTO International Conference on Health & Usage Monitoring, Mar. 10-12, 2009 Melbourne, Australia.
S.Moon, et al. "Fatigue Life Reliability Based on Measured Usage, Flight Loads and Fatigue Strength Variations", AHS 52nd Forum, Washington, D.C., Jun. 4-6, 1996.
S. Arms, et.al. "Energy Harvesting Wireless Sensors for Helicopter Damage Tracking", AHS Internation Forum 62, HUMS III, Phoenix, AZ, May 11, 2006.
S. Arms, et. al. "Synchronized System for Wireless Sensing, RFID, Data Aggregation & Remote Reporting", AHS 65th Annual Forum, Grapevine, TX, 2009.
Pariflex http://www.pariflex.org/.
EflyBook http://www.eflybook.com.
M. El-Bakry, "Component Tagging and Tracking—An Essential Enabling Technology for Effective 'Safe Life' Structural Life Monitoring," Aircraft/Space Applications, 5th Intl. Workshop on Structural Health Monitoring, Stanford, CA, Sep. 12-14, 2005. p. 521-528.
Notification of Transmittal of the International Search Report and the written opinion of the international searching authority.

* cited by examiner

| FIG.8a |
| FIG.8b |

COMPONENT RFID TAG WITH NON-VOLATILE DISPLAY OF COMPONENT USE INCLUDING THE USE OF ENERGY HARVESTING

PRIORITY

This application claims the benefit of U.S. Provisional Patent Application 61/179,336, filed May 18, 2009, "Component RFID Tag with Non-Volatile Display of Component Use," incorporated herein by reference.

RELATED APPLICATIONS

This application is related to commonly assigned U.S. Pat. No. 7,461,560, filed Mar. 28, 2005, "Strain Gauge with Moisture Barrier and Self-Testing Circuit," to Steven W. Arms et al., ("the '560 patent"), incorporated herein by reference.

This application is related to commonly assigned U.S. Pat. No. 7,719,416 filed Sep. 11, 2006, "Energy Harvesting, Wireless Structural Health Monitoring System," to Steven W. Arms et al., ("the '416 patent"), incorporated herein by reference.

This application is related to commonly assigned U.S. patent application Ser. No. 12/761,259 filed Apr. 15, 2010, "Wind Turbines and Other Rotating Structures with Instrumented Load Sensor Bolts or Instrumented Load Sensor Blades," to David Maass et al., ("the '259 application"), incorporated herein by reference.

This application is related to commonly assigned U.S. Provisional Patent Application 61/293,948 filed Jan. 11, 2010, "Wireless sensor synchronization methods," to Stephen J. DiStasi et al., ("the '948 application"), incorporated herein by reference.

This application is related to commonly assigned U.S. Provisional Patent Application 61/309,767 filed Mar. 2, 2010, "Harvesting Power from Multiple Energy Sources," to Christopher P. Townsend et al., ("the '767 application"), incorporated herein by reference.

This application is also related to commonly assigned U.S. patent application Ser. No. 12/782,622 filed May 18, 2010, "Scheme for low power strain measurement," ("the '115-074 application"), incorporated herein by reference, that also claims the benefit of the 61/179,336 provisional application.

BACKGROUND

Components on machines such as aircraft have a fatigue life that depends on factors including number of hours used and severity of use. A particular component may be used on one aircraft and later installed on another, making tracking these parameters a challenge. The present application provides several ways to accomplish this tracking.

Severity of use may be determined by measuring strain. One way to provide a low power strain measurement for fatigue life calculation was to turn power off, avoiding exciting strain sensors and supporting electronics except when sampling, as described in the '777 application. But the ability to reduce power was limited by the substantial amount of current drawn by the strain sensors and amplifiers during sampling. Especially in situations where the measurement required frequent sampling or turning on power rapidly to take a measurement, high power was needed. Not only did high bandwidth amplifiers that turn on quickly use more power they also introduced additional noise. And the power used by the system increased with the rate at which data was sampled. The high power consumption and high cost associated with providing sufficient power restricted the use of such systems. Thus, a better system for monitoring strain for fatigue life calculation is needed, and this system is provided by the present patent application.

SUMMARY

One aspect of the present patent application includes a system that includes a component, an electronic circuit, and a display. The electronic circuit and the display are on the component. The electronic circuit is connected to receive data related to use of the component. The electronic circuit is connected to the display for providing a time parameter related to at least one from the group consisting of remaining life of the component and life expended by the component. The time parameter is for displaying on the display.

Another aspect of the present patent application includes a method of displaying information about a component. The method includes providing the component, wherein the component includes an electronic circuit and a display. The method also includes providing data related to use of the component to the electronic circuit. The method further includes providing output from the electronic circuit to the display for displaying a time parameter related to at least one from the group consisting of remaining life of the component and life expended by the component. The method also includes displaying the time parameter on the display.

Another aspect of the present patent application includes a method of displaying information about a component. The method includes providing the component, wherein the component includes an electronic circuit, an RFID, and a display. The method also includes providing a data base external to the component and receiving data related to use of the component from the data base with the RFID. The method further includes providing information based on the received data for displaying on the display.

DETAILED DESCRIPTION

A non-volatile electronic ink display is used to provide a visual indication of the health, remaining lifetime, and/or status of a vehicle, machine, structure, component, or other item. In one embodiment, the display is integrated with a smart RFID tag affixed to a structural component. Usage data collected from sensors on the component or from transmission from another source, such as a data base, is used to update the display periodically. Maintenance providers are then able to look at the display on the component and immediately determine its health, remaining life and/or status (OK or failed) from information provided on the display.

Figure 1:
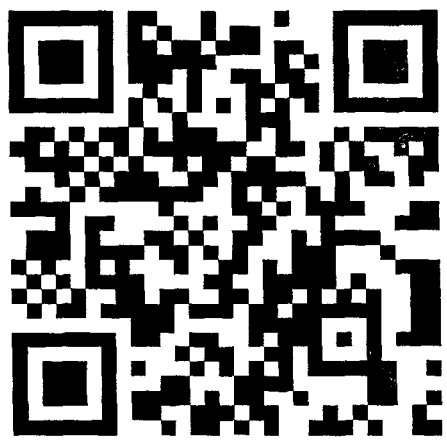
FIG. 1 illustrates a 2-dimensional bar code or QR code.

In one embodiment, the information is displayed as text. In another embodiment, the information is displayed as a bar code. The bar code can be a 2-D bar code, often called a QR code. An example QR code is provided in FIG. 1.

Figure 2:
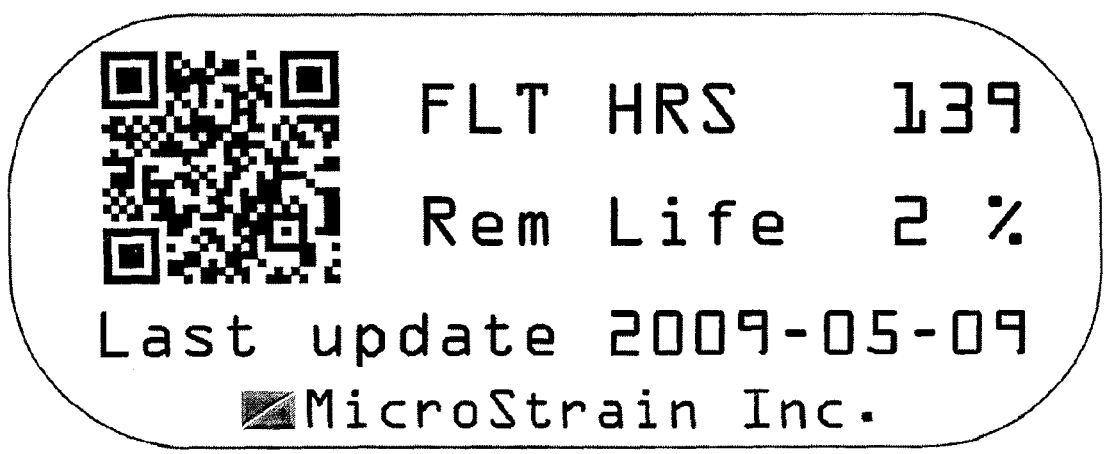
FIG. 2 illustrates a non-volatile display for mounting on an aircraft part in which the display shows the QR code of the part, the flight hours experienced by the part, the remaining life of the part, and the date the information was last updated.

In one embodiment QR codes are included on an external surface of RFID tags and/or on the non-volatile display, as shown in FIG. 2. These QR codes could thus be a permanent code printed on the tag. Alternatively, these QR codes can be displayed on the non-volatile display and can be dynamically changed as part of the RFID tag's electronic ink display.

In one embodiment, the QR code allows the information related to the particular tag (and component to which the tag is affixed) to link to a website or to a database with more information, such as a record of historical sensor data for the component, the manufacturer's lot number, the serial number of the aircraft that the part was previously installed on, etc. For example, as described in the news article at http://www-.centernetworks.com/google-qr-codes-print-advertising, "you can simply whip out your cell phone, take a picture of the 2D barcode (using specific software installed on your cell phone that recognizes/decodes the 2D barcode) and then your phone's web browser opens and automatically takes you to a corresponding website with more information on the product/service that you're interested in."

In another embodiment the QR code communicates relevant information directly accessible via the 2D barcode scan, such as data previously stored, or data derived from a sensor or sensors on the component on which the QR code is mounted, as opposed to data derived from a link to a database or a URL. At the present time each standard QR code is capable of communicating up to 2,953 bytes of data as described at http://www.denso-wave.com/qrcode/qrfeature-e.html.

The standard 3 KB of data available with the QR code is itself sufficient to communicate many relevant static and dynamic parameters, including manufacturer ID, serial ID/EPC, flight hours, flight dates, miles driven, remaining life estimated, remaining life calculated locally, remaining life calculated and loaded externally, repair history, detailed, traceable pre-deployment history for manufacture, assembly, & transport, sensor calibration information, and summarized sensor data statistics.

Thus, the non-volatile electronic ink display of the present patent application supports both a centralized, database driven approach with a link to a database or URL and it also supports a low-level distributed approach, with data directly displayed. The former is more scalable, allowing access to vast stores of data on line. The latter is advantageous in certain environments where network access is unavailable, sparse or intermittent. In one embodiment, both approaches are included, providing immediate component information as well as a database link/URL.

Several 2D matrix barcode alternatives to the QR code can be used, with varying sizes, data capacities, and intended markets, as described at http://en.wikipedia.org/wiki/Barcode#2D barcodes. One example is a 2D tag, commonly known as data matrix http://en.wikipedia.org/wiki/Data_Matrix#cite note-1, that appears to be covered by an ISO standard and is license/royalty free.

In one embodiment, human readable information, such as text and/or image, is written to the non-volatile display, such as the component's remaining life in percent, assuming the component will be operated in a manner similar to its historical record. Paper white, non-volatile displays available from by E Ink Corporation, Cambridge, Mass., as illustrated at http://www.eink.com/, can be used. One example of the e-ink display used to passively indicate how many hours a component has been flown, how much life remains, and when the last update to the non-volatile display was made, is shown in FIG. 2.

An e-ink display holds the last graphic image or alphanumeric characters written to it, even if the power to the display is shut down or has become unavailable. Thus the component (with affixed smart RFID tag, processor and sensor) can display the information, such as the component's remaining life or severity of usage—or that a critical operational or environmental parameter was exceeded, such as temperature, humidity, strain, shock, pressure, or usage. We have shown that these non-volatile displays will hold their graphics with no power over a temperature range of −40 to +85 degrees C.

In one embodiment, an active RFID tag with an integral non-volatile display uses a method such as described in a paper, "Architecture for Dynamic Component Life Tracking in an Advanced HUMS, RFID, and Direct Load Sensor Environment," by N. Iyyer, et al, Sixth DSTO International Conference on Health & Usage Monitoring, 10-12 March, 2009, Melbourne Australia, incorporated herein by reference. The method was "developed by Technical Data Analysis, Inc. ("the TDA method") to track usage and history of all uniquely serialized components throughout their lifetime, so that component life limits and applicable maintenance data are correctly and continuously assessed." The present applicants found that the TDA method could be used to access HUMS data or vehicle bus data. The TDA method uses the data to compute remaining life based on regime recognition. Remaining life so computed is then provided back to each tag to update the information shown on the non-volatile display. Other methods of computing remaining life can also be used.

In another embodiment, a smart passive RFID tag with an integral non-volatile display performs this remaining life calculation itself. In this embodiment, data about severity of use is written to the RFID tag with a wand or transmitted to the RFID tag. An ultra wide band radio, such as DW4aSS1000, from decaWave, Ltd. can be used to localize the component on the aircraft.

In another embodiment a direct loads monitoring sensor with wireless sensing and energy harvesting is provided along with the smart passive RFID tag with an integral non-volatile display. The energy harvesting can be accomplished with a piezoelectric patch, a solar cell, a dynamo or a thermoelectric generator.

In one embodiment a smart tag for aircraft is implemented that uses only flight hours to determine remaining life. In this case, remaining life is calculated by the tag itself. Thus, in this embodiment, no radio link need be provided. In one scheme, the tag uses a simple inertial motion detector, such as an accelerometer, and a clock to record duration of time in operation. In one embodiment, the accelerometer is used to detect vibration which is indicative of operation. In another embodiment, the accelerometer is used to detect orientation, as change in orientation may show operation of an aircraft. An altimeter or pressure sensor can also be used for determining operation of an aircraft. A temperature sensor can be used to detect engine use. A microphone can be used to detect noise indicative of operation. An energy harvesting device can also serve to detect operation. For example it may be set to harvest energy from vibration, from strain, from a turning wheel, or with a Peltier device from a temperature gradient, all indicative of operation. In one embodiment, electricity derived from the energy harvesting is used to power a clock. In this embodiment, the clock only receives energy for keeping time when energy is being harvested. If energy is only harvested when, for example a machine to which the energy harvester is mounted is operating and vibrating, then the clock will record the accumulated hours of machine operation. The integral non-volatile display is updated with hours in use, for example flight hours, and hours of life remaining, based on output of this clock. Time the motion detector is producing an output or time a temperature sensor is showing an elevated temperature can also be used for determining accumulated hours of machine operation. For a component such as a motor, that produces heat, a thermal energy harvester can provide sufficient electricity for operating a circuit, including measuring time and other functions, such as wireless communication. This scheme is also useful for a range of applications, such as for displaying accumulated engine hours of use in a boat, or hours of use on car shock absorbers or bike frames.

In other embodiments using this concept, a sensor provides data from which a parameter for display is determined and displayed. For example, frozen food in transit could be monitored for temperature changes and the non-volatile display updated with the maximum temperature that occurred, along with the time (and duration of time) at which the temperature(s) may have exceeded a specified threshold. In other examples, another sensed parameter or information derived from another sensed parameter, such as strain, shock, and pressure, is displayed. In all these cases the radio link can be eliminated, since the local sensor provides the data for the non-volatile display.

In many of these embodiments, so little power is consumed that a standard battery can provide sufficient power for long-term operation. However, the present applicants recognized that in these embodiments, as the component's sensed parameter or parameters becomes more power hungry, such as by making measurements at a high sample rate or where duty cycling of the sensors is not available due to the component's particular monitoring requirements, such as providing ever-vigilant operation, then the battery's design capacity will increase or energy harvesting becomes an increasingly important element in the smart tag's design.

Figure 3A:
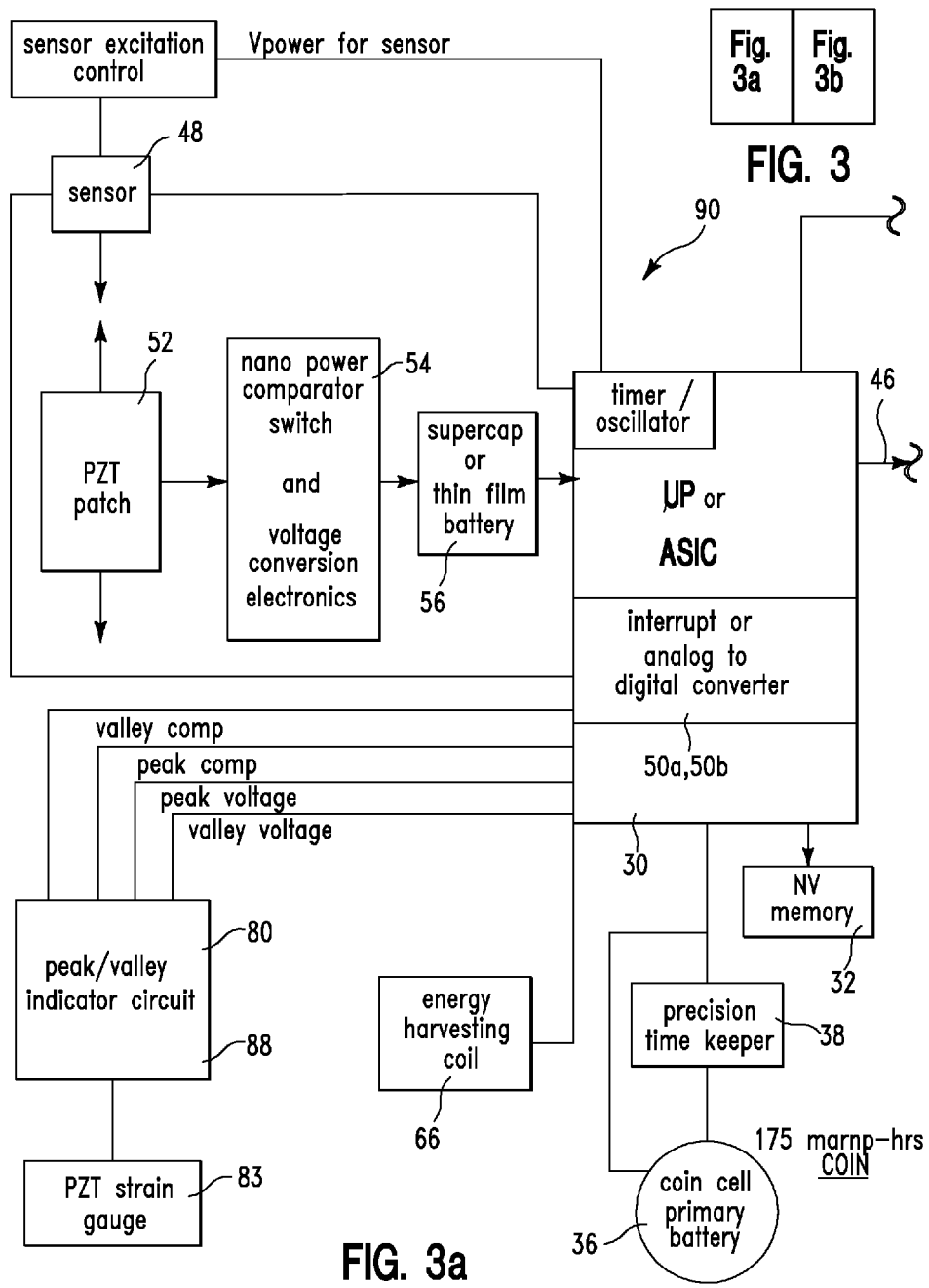
FIG. 3a is a block diagram illustrating a zero-power consuming energy harvesting network updating sensing RFID tag with a non-volatile display which can send and receive data wirelessly, communicate to the internet, and display parameters.
Figure 3B:
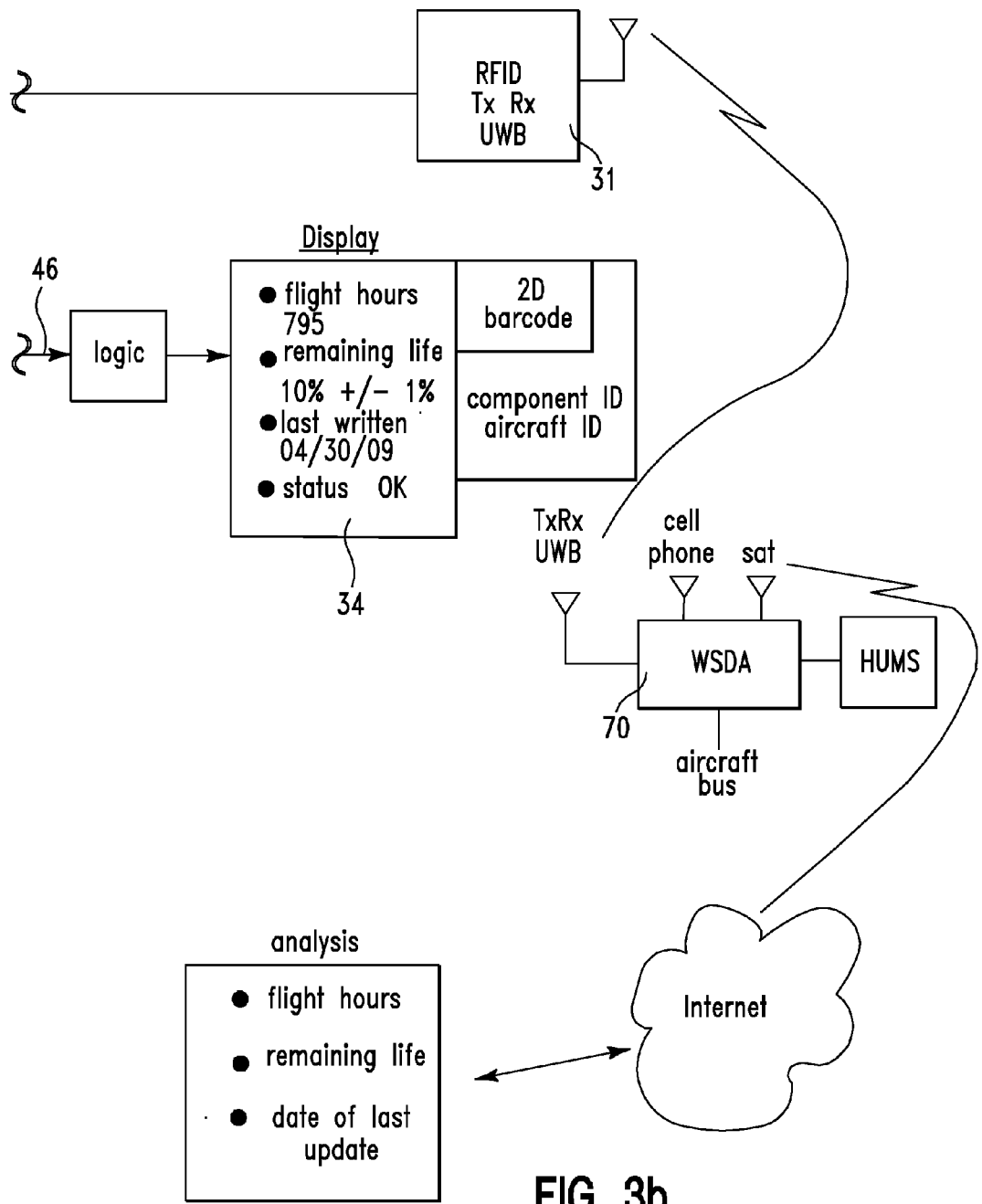
FIG. 3b is a three dimensional view of an implementation of circuit elements in the block diagram of FIG. 3a illustrating a strain gauge sensor module with energy harvesting and wireless communication.
Figure 3C:
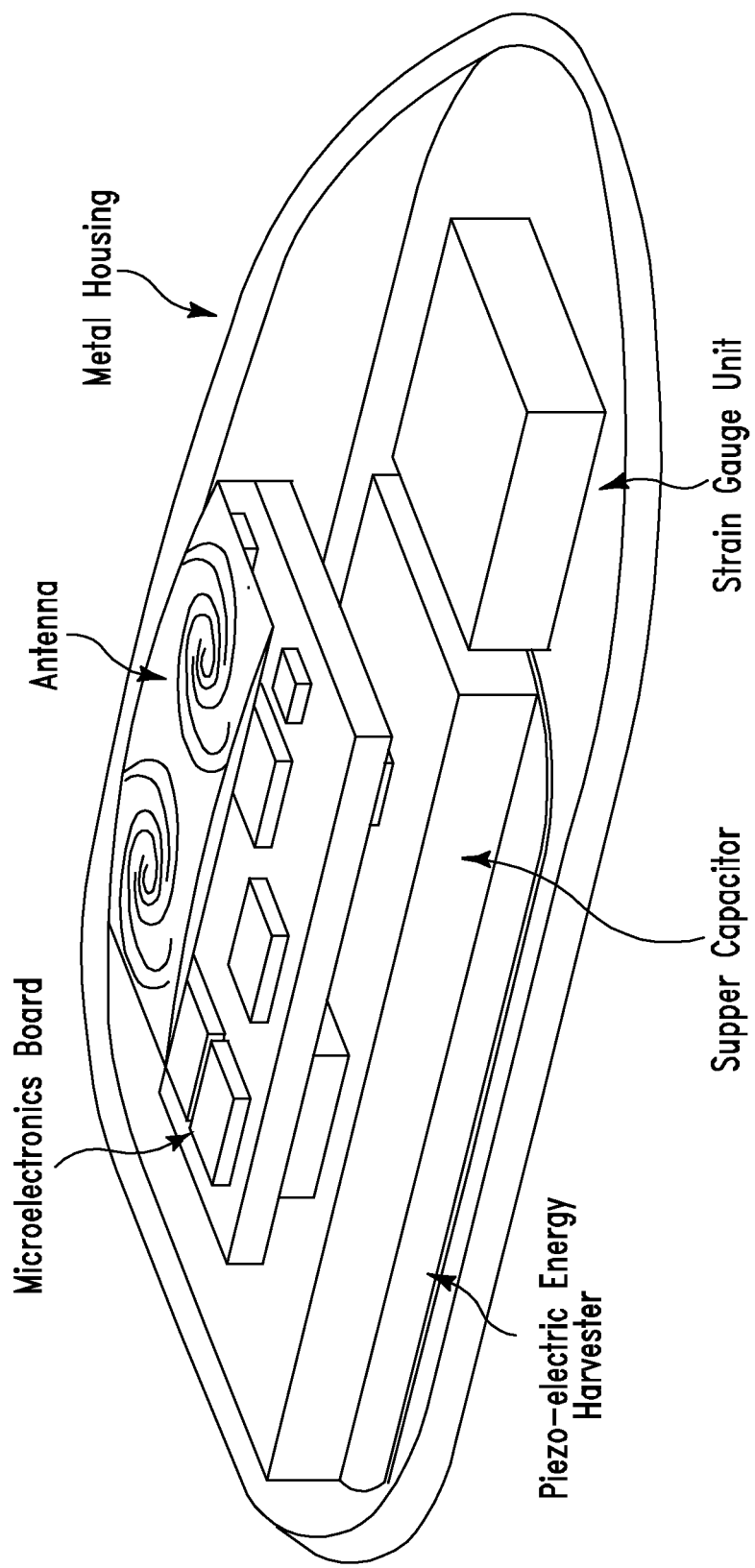
Figure 4:
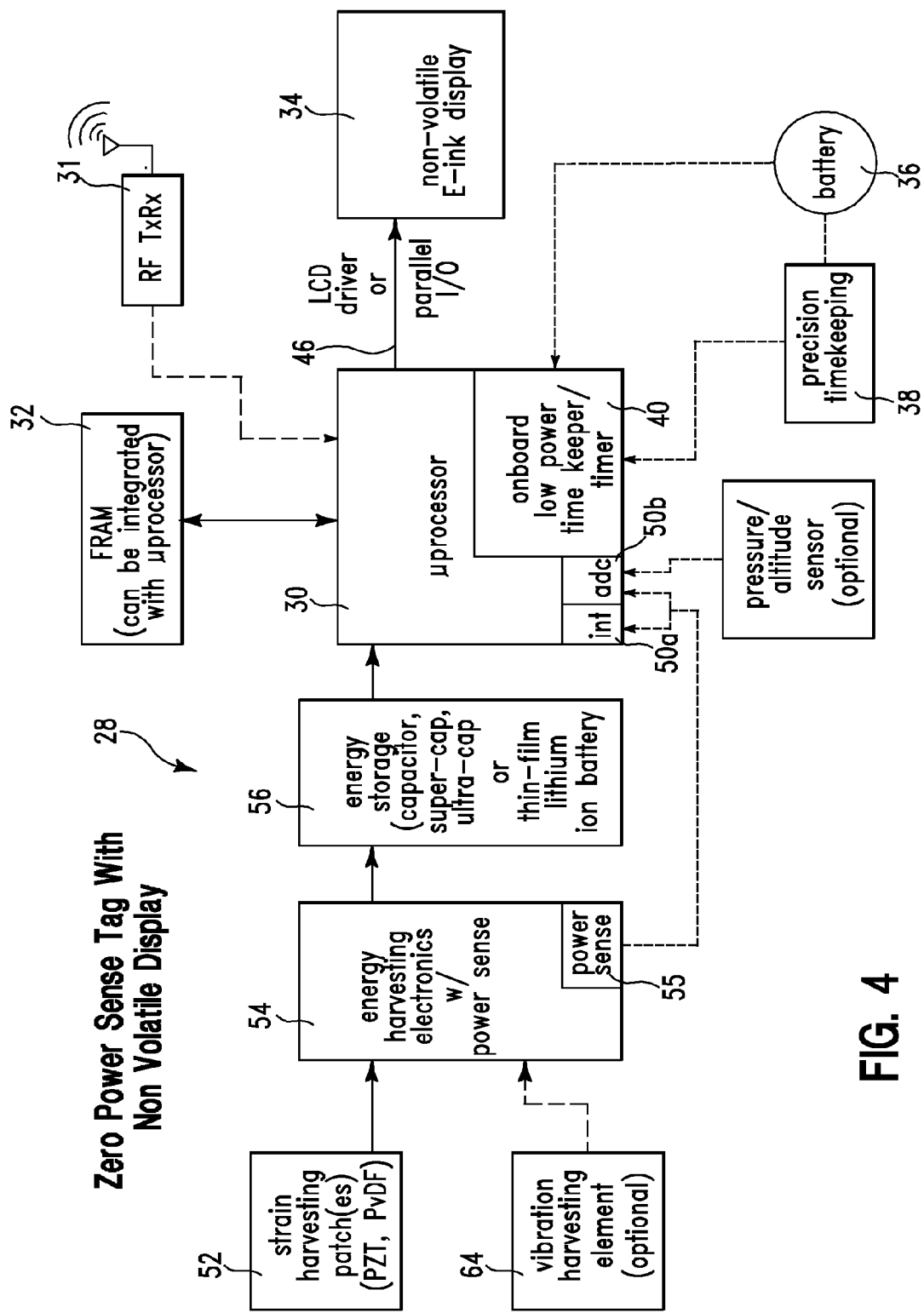
FIG. 4 is another block diagram illustrating a zero-power consuming energy harvesting updating sensing RFID tag with a non-volatile display.

Block diagrams of embodiments of component RFID tag 28 that has a non-volatile display are shown in FIGS. 3a and 4. An implementation is shown in FIG. 3b. Microprocessor 30, such as the MSP430, available from Texas Instruments, Dallas, Tex., has connections to a RF transmitter and receiver or transceiver 31, non-volatile memory 32, such as FRAM or EEPROM, non-volatile display 34 (such as e-ink), and energy storage elements 36, such as rechargeable battery and/or a primary battery. Transceiver 31 can be an ultra wide band radio (UWB), as shown in FIG. 3 or another communications device. In one embodiment, precision timekeeper 38, such as the DS3234, is used to enhance the performance and stability over temperature of the timing information to be used by microprocessor 30. Alternatively, microprocessor 30 can use its own on-board low power timer 40 to calculate elapsed time. Digital input/output (I/O) lines 46 from processor 30 are used to drive non-volatile display 34. Sensors 48, such as absolute pressure sensors, acoustic pressure sensors, strain sensors, load sensors, and motion sensors, such as accelerometers and vibrometers, can be used as inputs to microprocessor analog to digital converter (ADC) 50. Strain sensors include resistive, piezoelectric, piezoresistive, capacitive and inductive. In one embodiment, motion sensor input is used by microprocessor 30 to detect when the component is in use, for example when the aircraft is flying. Many of the components shown in FIGS. 3a and 4 can be included to fulfill a specific purpose or they can be omitted.

In one embodiment, strain energy harvesting is accomplished with an energy harvesting material, such as PZT patch 52, available from Smart Materials, Inc., Liberty, Tex. and Advanced Cerametrics, Inc., Lambertville, N.J. In another embodiment, the strain energy is harvested using piezo polymer films (PvDF).

In one embodiment, energy harvesting electronics 54 converts the voltage provided by energy harvesting material 52, 64 into a voltage suitable for storage onto one or more energy storage elements, as described in commonly assigned U.S. Pat. No. 7,081,693, incorporated herein by reference. Energy harvesting electronics 54 may include power level threshold detection circuit 55, such as a nanoamp comparator switch, which is connected to an interrupt line 50a on microprocessor 30 or to ADC 50b of microprocessor 30.

Processor 30 is powered by energy derived from energy harvester 52, 64. For example, the energy derived from the energy harvester can be stored in a rechargeable battery or super capacitor 56. Processor 30 can also be powered with energy from a primary battery. If processor 30 is powered with energy from a primary battery, an energy harvester can be used to act as a sensor to detect when a vehicle, such as an aircraft, or a machine, or component is in use, and to provide an indication of the severity of use. Additional energy harvesting or energy collecting devices can be included, such as coil 66 which collects energy from a source of radiation, such as a closely coupled RF source. One such coil, part number 4513TC-404XGL is available from Coilcraft, Inc., Gary Ill., and works at 125 Khz from a source generating radiation at that frequency. Power collected by coil 66 is converted on board to dc to provide power for operating microprocessor 30, transceiver 31, and other components of RFID tag 28. In one embodiment, power is provided by energy harvesting devices 52, 64 when strain or vibration is available and power is provided by coil 66 when energy harvesting components 52, 64 are not receiving strain or vibration, for example, when an aircraft is not in operation.

Macro Fibre Composite, available from Smart Materials, Inc., Sarasota, Fla., and bulk piezoelectric materials have been used to harvest energy from a component's cyclic strain of operation to power a wireless sensor, as described in papers by Arms et al, AHS 2006, 2007, and 2009, incorporated herein by reference (see attached title pages for titles, authors, and publication information).

The present inventors recognized that higher energy output from a strain energy harvester would be a good indication that the severity of usage has increased. This information is then used to provide an improved estimate of fatigue life expended (FLE) as compared to relying on flight hours alone. A load history indicating damaging usage includes a load exceeding a threshold. The load history indicating damaging usage includes fatigue inducing cyclic loading. If information derived from recorded data shows that a component experienced a load history indicating damaging usage the component may be replaced. An operator receiving information about a load exceeding a threshold may alter the way the structure is being used, for example by operating in a way that reduces the loading.

In one embodiment, when connected to interrupt line 50, microprocessor 30 is "woken up" from sleep to record that a threshold of energy generation has been crossed. Achieving that energy generation threshold indicates that a sufficiently high level of strain was experienced. If that energy generation threshold is crossed at higher frequency this would indicate that component usage is more severe because of increased frequency of strain above the amount needed to reach that energy generation threshold.

In one embodiment, once woken up, processor 30 uses ADC 50 to sample the strain energy harvesting power production level more frequently. Sampling at a higher rate enhances the processor's estimate of severity of usage, which allows a better estimate of the fatigue life expended than would be available from a determination of flight hours alone.

In some cases, while vibration may be present, the strain level experienced by the component under test may be relatively low. In that case, applicants have placed strain harvester 52 onto a flexible, tuned substrate (such as a tapered cantilever beam), in order to capture energy generated by exposure to vibration, as described in commonly assigned U.S. patent application Ser. No. 11/604,117, "Slotted Beam Piezoelectric Composite," incorporated herein by reference. In this embodiment, as the vibration harvester's output increases, processor 30 uses that increased output to estimate severity of usage, which again facilitates an improved estimate of component remaining life than would be available from a determination of flight hours alone.

In some cases, it is important to know both the static and dynamic strains. The present inventors also recognized that by including a piezoresistive strain gauge capable of detecting static strain levels, and a piezoelectric strain gauge capable of detecting dynamic strains they could produce a hybrid sensing system that could monitor both static and dynamic strains, but with lower energy consumption as compared to a piezoresistive strain sensor alone. They recognized that if the static strains are changing relatively slowly, this piezoresistive or foil type strain gauge sensor can be sampled at a lower sample rate than the dynamic strains for the purpose of fatigue life calculation. They also recognized that the dynamic strains can be acquired from a piezoelectric strain gauge without any external source of excitation energy and that uses the motion being measured to provide the energy measured. Thus, the dynamic response of the piezoelectric energy harvesting elements is used as a sensor for the changing component strains, with the advantage that this type of sensor generates its own power and needs no additional excitation current, thus, avoiding expenditure of energy for tracking the dynamic response. This can be accomplished by adding a piezoresistive or foil type strain gauge as a sensing element, connected to an ADC line of the processor along with a piezoelectric strain gauge. In this embodiment, the processor acquires the static and dynamic strains and uses this information, along with the component's unique geometrical and material properties, to compute an FLE for the component and to update the non-volatile electronic ink display.

One example of an accelerometer sensor and "shake and wake" sensor that can be used by the MSP430 microprocessor to determine when a machine is in operation, for example, flying, is the ADXL346, available from Analog Devices, Norwood, Mass. The ADXL346 is a small, thin, low power, three-axis accelerometer with high resolution (13-bit) measurement at up to ±16 g. Digital output data is formatted as 16-bit twos complement and is accessible through either a SPI (3- or 4-wire) or I2C digital interface. Either of these digital interfaces can be used to interrupt the MSP430 microprocessor from sleep or as a sensing line to allow the processor to form a better estimate of the severity of component usage.

The ADXL346 accelerometer is well suited for mobile component applications. It measures the static acceleration of gravity in tilt-sensing applications, as well as dynamic acceleration resulting from motion or shock. Its high resolution (4 mg/LSB) enables measurement of inclination changes as little as 0.25°. Several special sensing functions are provided. Activity and inactivity sensing detect the presence or lack of motion and if the acceleration on any axis exceeds a user-set level. Tap sensing detects single and double taps. Free-fall sensing detects if the component is falling. These functions can be mapped to one of two interrupt output pins. An integrated 32-level first in, first out (FIFO) buffer can be used to store data to minimize host processor intervention. Both 4- and 6-position orientation sensing are available for 2- and 3-D applications. Low power modes enable intelligent motion-based power management with threshold sensing and active acceleration measurement at extremely low power dissipation.

One disadvantage of the ADXL346 accelerometer is that it requires power to operate. Applicants found that they could overcome this disadvantage by using passive sensors that require no external source of power for operation. Passive sensors, such as the SQ-SEN-200 series sensor, available from SignalQuest, Inc., Lebanon, N.H., act like a normally closed switch that chatters open and closed as it is tilted or vibrated. Unlike other rolling-ball sensors, the 200 is truly an omnidirectional movement sensor. It will function regardless of how it is mounted or aligned. When at rest, it normally settles in a closed state. When in motion, it will produce continuous on/off contact closures. It is sensitive to both tilt (static acceleration) and vibration (dynamic acceleration). The sensor can be easily used to produce a series of CMOS or TTL level logic level or pulse train using a single resistor to limit current. In one embodiment the signal level is read directly by a digital input and used to interrupt, or wake up a microcontroller. In another embodiment, the number of signal levels above a threshold is counted to estimate the amount and duration of activity. The sensor is fully passive, requires no signal conditioning, and the microcontroller interrupt interface draws as little as 0.25uA of continuous current.

In another embodiment, the energy harvesting element is separate and distinct from the sensing elements. As described herein above, the output from the energy harvester alone can also be used to compute an estimate of FLE.

The present applicants also recognized that individual RFID tag 28 with non-volatile display 34, battery backed timekeeper 36, 38, and an on-board database of its component and aircraft serial numbers, can display its remaining life on its non-volatile display 34 in an embodiment that does not necessarily include motion sensors integrated with RFID tag 28. This embodiment is accomplished by relating the component's flight hours on each specific aircraft on which it served to another data set collected by that aircraft's flight computer and/or its health and usage monitoring system (HUMS) 68, and/or any other data collection system such as wireless sensor data aggregater (WSDA) 70. These on-aircraft monitoring systems can estimate the severity of vehicle usage through characterization of various flight regimes ("regime recognition") experienced. For each flight regime experienced, such as straight and level, pull-ups, and gunnery turns, there is available a related estimate of the fatigue life expended for each component on the aircraft, based on an instrumented flight test for that aircraft. The paper, "Fatigue Life Reliability Based on Measured Usage, Flight Loads and Fatigue Strength Variations," by Dr. Suresh Moon, et al., ("the Moon paper") presented at the American Helicopter Society 52$^{nd}$ Annual Forum, Washington, D.C., Jun. 4-6, 1996, incorporated herein by reference, provides further information. Thus, since the time and date that each of these regimes was flown are known to the on board monitoring system on each aircraft, the communication of the stored data about each permits on-board microprocessor 30 to add up the lifetime effects of each lifetime detractor and update non-volatile display 34 on tag 28 for each component to be updated with its individual FLE estimate.

WSDA 70 for the structural health monitoring system 68 supports data recording and remote access from wireless transceiver 31, as shown in FIG. 3. WSDA 70 serves as the data aggregation engine for the system. It can also acquire data from cell phone, satellite, and internet, as shown in FIG. 3. It can also acquire data from hardwired, high speed networked sensors, such as the aircraft bus, as also shown in FIG. 3. WSDA 70 may aggregate data from other sources, as described in commonly assigned and co-pending U.S. patent application Ser. No. 11/518,777, incorporated herein by reference, such as an inertial sensing subsystem (ISS) as well as data from a wireless sensing network or wireless sensing node. It may receive data from an energy harvesting and load sensing component, such as the pitch link of a helicopter. In one embodiment, WSDA 70 includes components integrated within its enclosure, including IEEE 802.15.4 transceiver, cellular connectivity, flash EEPROM for data logging, an on board DSP with structural usage algorithms, a cockpit notification display, a can bus and a vehicle bus. WSDA 70 can be located on the aircraft or it can be located on a ground vehicle that communicates with the aircraft or it could be in a hand held device where it could be used to query the wireless network.

This embodiment illustrates a scheme for a component's remaining life to be computed externally but does not require sensor data to be provided by sensors on the component itself. In this embodiment, time data is used and data from a sensor on the component is optional. From information about when a component was flying, and information about what the aircraft using that component was doing during that time—information readily available from standard systems on the aircraft—models are used to estimate what type of life limiting usage that part experienced and to estimate the corresponding reduction in component life. In this embodiment, all of this is computed externally and periodically pushed back onto the component's tag 28 and displayed on its non-volatile display 34.

In one embodiment real time timekeeper 38 provides date and time for time stamping sensor-provided data related to operation of the aircraft or the machine. Microprocessor 30 periodically wakes up from sleep to see if the aircraft is flying and records the number of hours flown and time and date of each flight. When the aircraft lands a data base queries tag 28 to record the hours it flew and download the logbook with the time stamped sensor data. The data may also include information regarding severity of flight. This information may be obtained from a separate system on the aircraft that takes pitch, roll, and yaw, stick position, and other measured parameters along with the aircraft's identification. Then the severity of flight regimes is computed based on that data, as described in the Moon paper. Hours, dates and time recording can then be related to severity of usage.

The present applicants also designed a device that combines several features to allow measuring strain at very high data rate and at very low power. The device allows continuous monitoring of both static and dynamic loading and yet uses little power. In one embodiment, such low power is consumed for the measurements that the life of a battery used for powering the device approaches the shelf life of the battery. Alternatively, power requirement is so low that energy harvesting can be used to provide power from an ambient source, such as the varying strain itself, vibration, or light, eliminating the need for replacing a battery.

The present applicants found a way to measure dynamic strain continuously while completely avoiding power consumption while taking the strain measurement. Thus, they were able to capture dynamic change in loading at the equivalent of a high data rate without power consumption. In one embodiment, the present applicants used a low power amplifier and a method of recording data that vastly reduces current draw for taking and analyzing data for an application, such as determining fatigue life of a component or structure.

In addition, the present applicants found an extremely low power method of periodically measuring the mean load, whose value is also used in determining fatigue life. Thus, this patent application provides various embodiments of ways to monitor dynamic strain at very high data rate, monitoring static strain, and determine fatigue life while consuming orders of magnitude less power than has otherwise been achievable.

Figure 5:
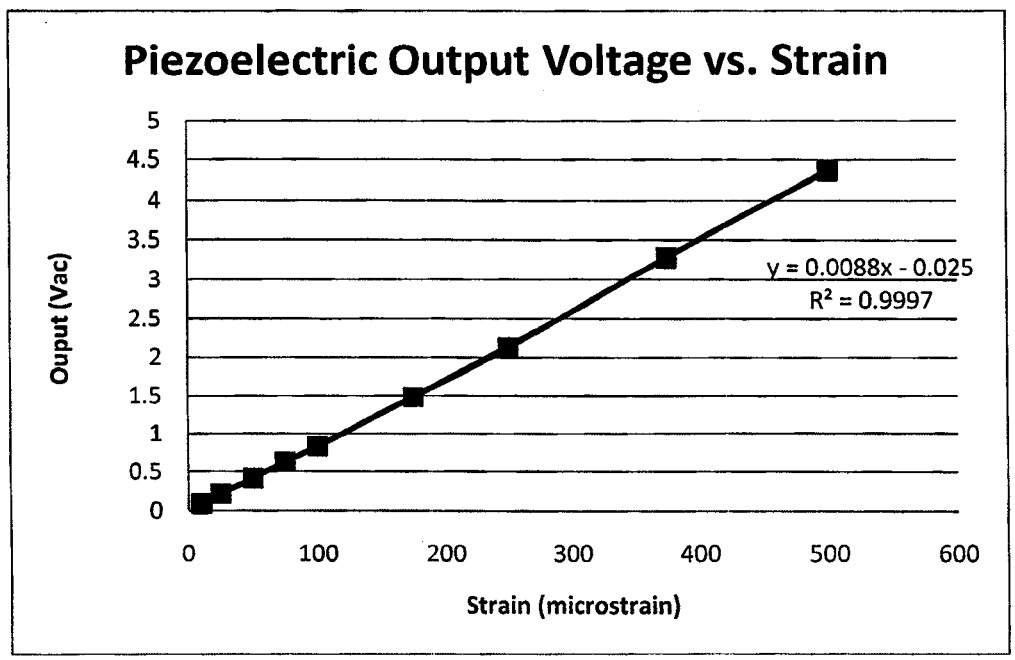
FIG. 5 is a graph showing the linear relationship between piezoelectric output voltage and strain.

In one embodiment, piezoelectric strain gauges are used in combination with conventional resistive strain gauges and an improved sampling and data analysis technique. The present applicants found that piezoelectric strain gauges generate a voltage proportional to the applied strain. As shown in FIG. 5, piezoelectric output voltage v. strain shows a linear relationship. Thus, the piezoelectric strain gauges continuously supply a voltage proportional to strain, providing a steady stream of changing strain data while avoiding current draw and energy consumption for operating the strain gauges. Since they generate their own power, their operation does not require drawing energy from an external source of power or from an energy storage device, eliminating one power consumption issue.

However, piezoelectric strain gauges only provide a dynamic response. That is, they only provide strain information while strain is changing. When strain is constant the piezoelectric strain gauge reading goes to zero.

The present applicants also provided an embodiment that uses information from the piezoelectric strain gauges not just for their high data rate dynamic strain information but also for providing timing for when to record data coming from the piezoelectric strain gauges. In one embodiment, the time for recording is at peaks of the data. Because the data is recorded only at intervals and because those intervals are just where needed for determining fatigue life, little energy is consumed for the dynamic strain measurement even at the equivalent of a high data rate because only one sample is taken to record each peak and each valley.

In one embodiment, peak indicator circuit 80 includes peak detector 82 and comparator U5. Peak detector 82 includes op amps U1 and U2, diodes D1 and D3, capacitor C1, and resistors. Op amp U1 charges capacitor C1 to a voltage equal to the maximum voltage seen on input waveform IN obtained from the piezoelectric sensor 83. Diode D3 prevents any discharge of capacitor C1 when the voltage on IN later declines from its peak value. Op amp U1 sets its output connected to D3 at a value so its negative input connected to R2 is equal to its positive input connected to IN. With diode D1 providing feedback, op amp U1 must set its output one diode drop above IN. With D3 in series, C1 will therefore be charged to a voltage equal to IN.

Op amp U2 has its negative input and its output tied together at PEAK. Therefore PEAK follows the voltage applied to the positive input of U2, which is also the voltage across capacitor C1. Thus, PEAK is equal to the voltage on capacitor C1 and PEAK is solidly maintained by the high impedance of op amp U2. Thus PEAK retains a latched value of the maximum voltage provided at IN. This PEAK voltage and IN are provided to the input terminals of comparator U5 for comparison.

Figure 6:
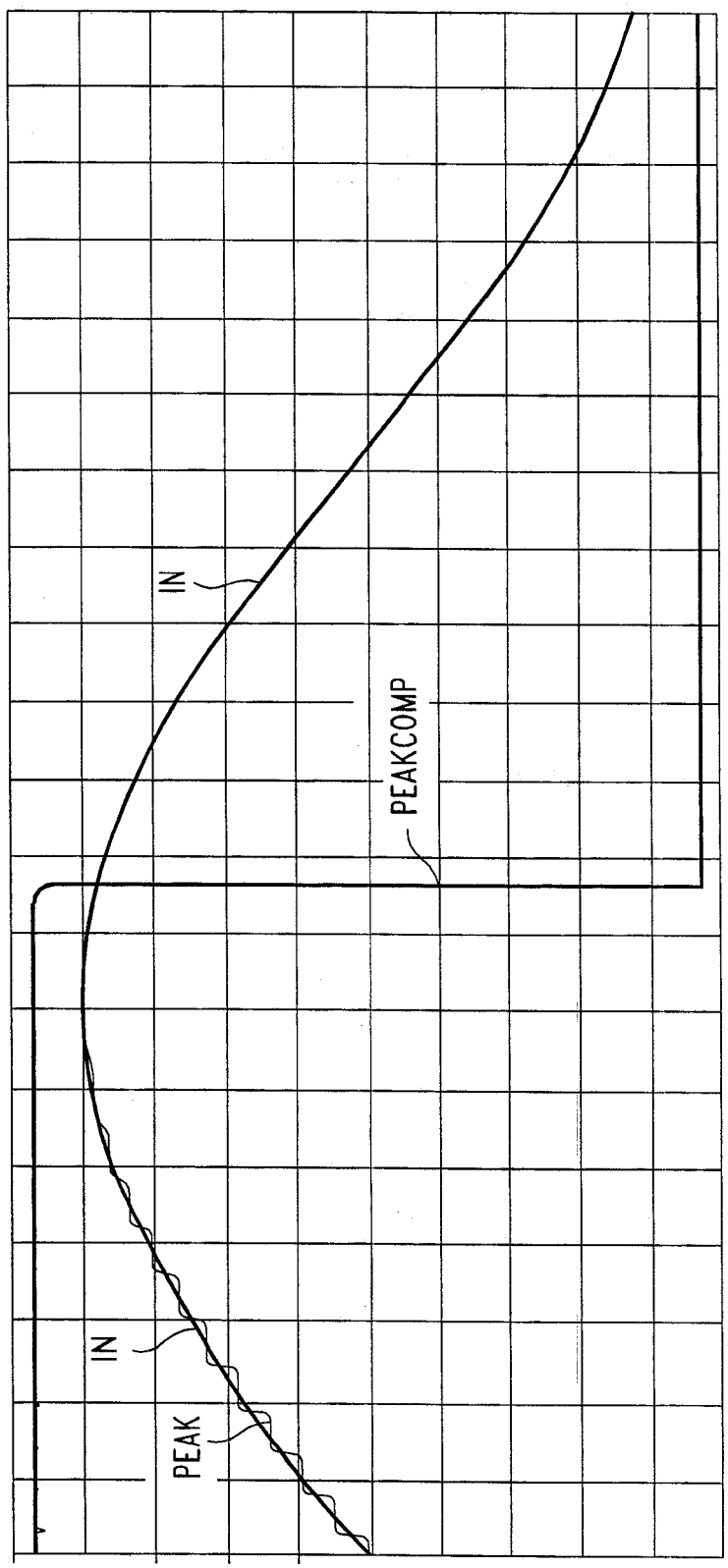
FIG. 6 is a simulated timing chart showing how the voltage IN provided by the piezo strain gauge, the output PEAK held by the peak detector, and the output PEAKCOMP of the comparator change with time.

The voltage IN provided by the piezo strain gauge, the output PEAK of peak detector 82 and the output PEAKCOMP of comparator U5 are shown for a simulation in FIG. 6. The voltage IN, the output VALLEY of valley detector 84 and the output VALLEYCOMP of comparator U6 are shown for actual data in FIG. 7. It is seen that VALLEY tracks with 1N while IN is decreasing toward its minimum value. Then VALLEY remains at that minimum value while IN increases from the minimum value.

Figure 7:
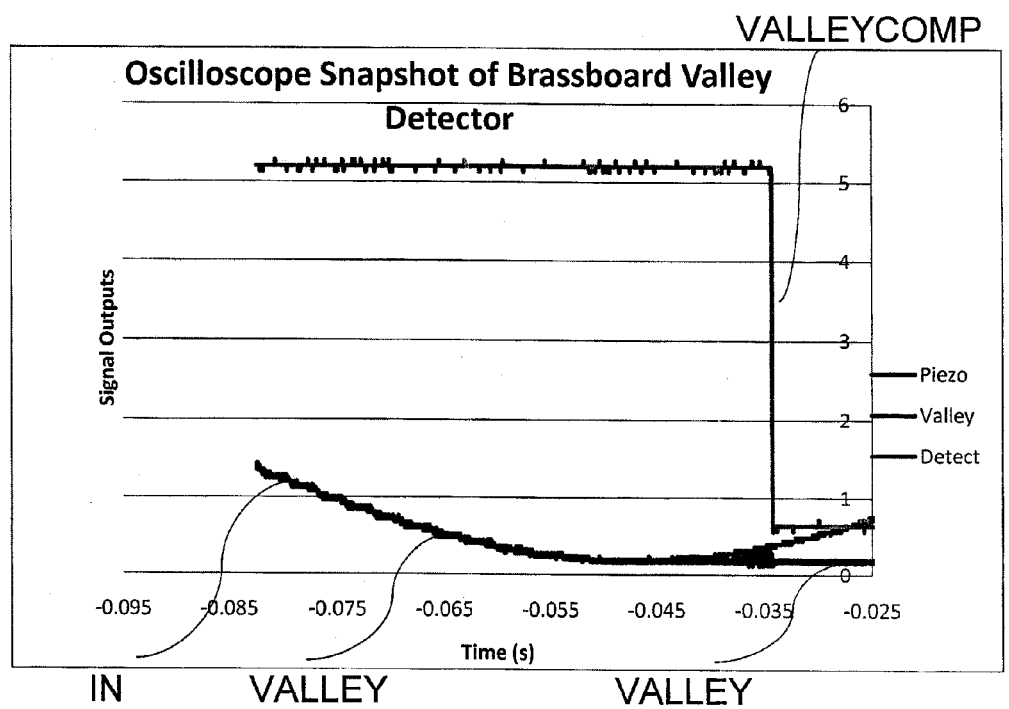
FIG. 7 is timing data showing how the voltage IN provided by the piezo strain gauge, the output PEAK held by the peak detector, and the output PEAKCOMP of the comparator changed with time during an experiment.

Comparators U5, U6 are a type that uses very low power to check the difference between what was most recently captured as a peak or valley of the input voltage and the present reading of piezoelectric strain sensor 83. This comparison is made continuously by the analog circuit elements, as shown in FIGS. 6 and 7. Once the present reading IN falls a specified amount below the most recent PEAK, comparator U5 determines that a peak has been reached; voltage output of comparator U5 drops; and this output of comparator U5 is fed to awaken microprocessor 86 and to command microprocessor 86 to sample and record the magnitude of PEAK. This specified amount is set at a level sufficient to ensure that noise does not trigger a peak detection. In one embodiment detection level is hardware programmable. Thus, microprocessor 86 remains in sleep mode until just the moment it is actually needed to receive and record peak data. Microprocessor 86 records that PEAK voltage and goes back to sleep.

Figures 8, 8A:
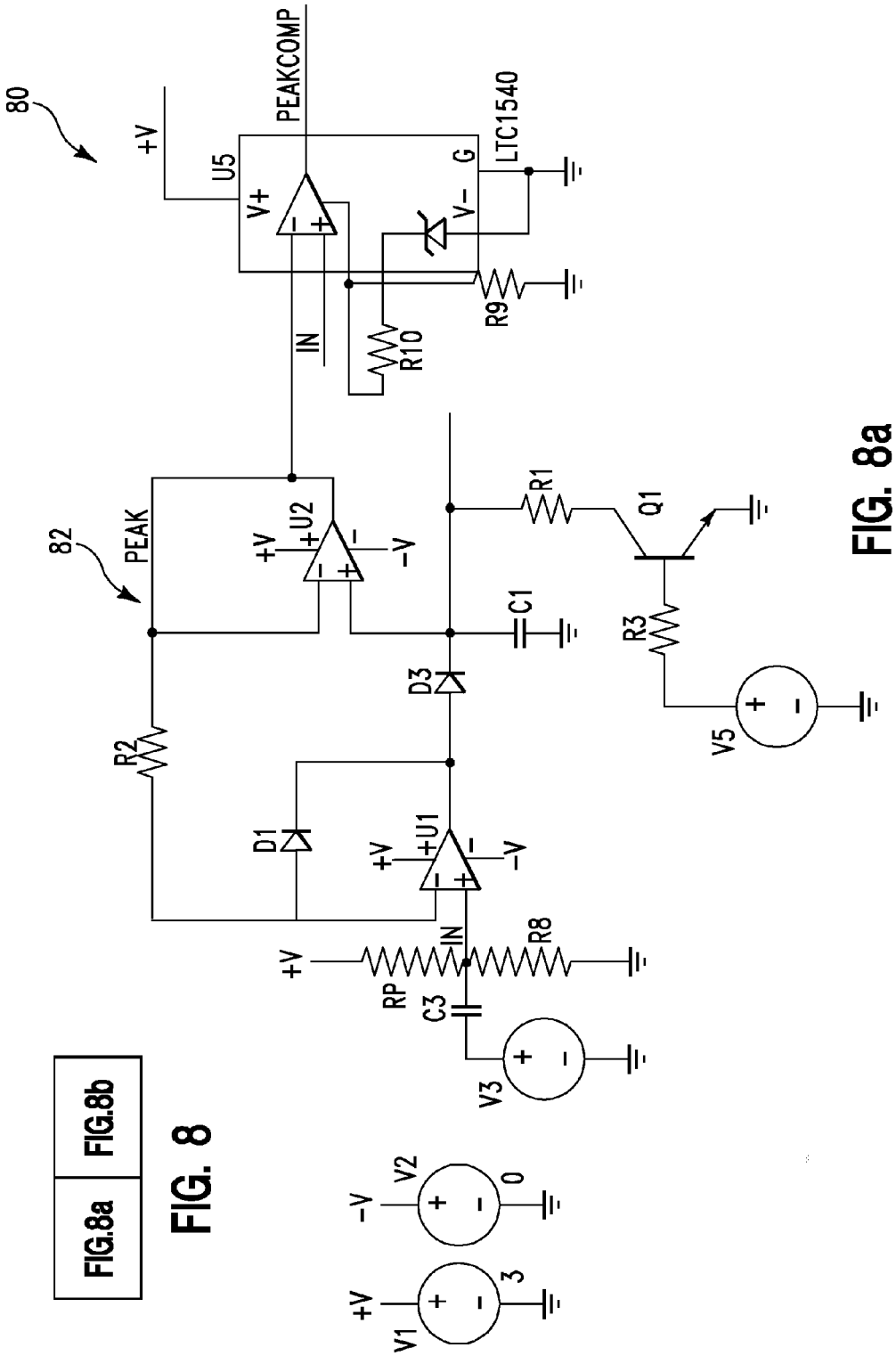
FIG. 8 is a schematic diagram of an embodiment of a circuit that may be used to capture peak values while consuming very little energy.
Figure 8B:
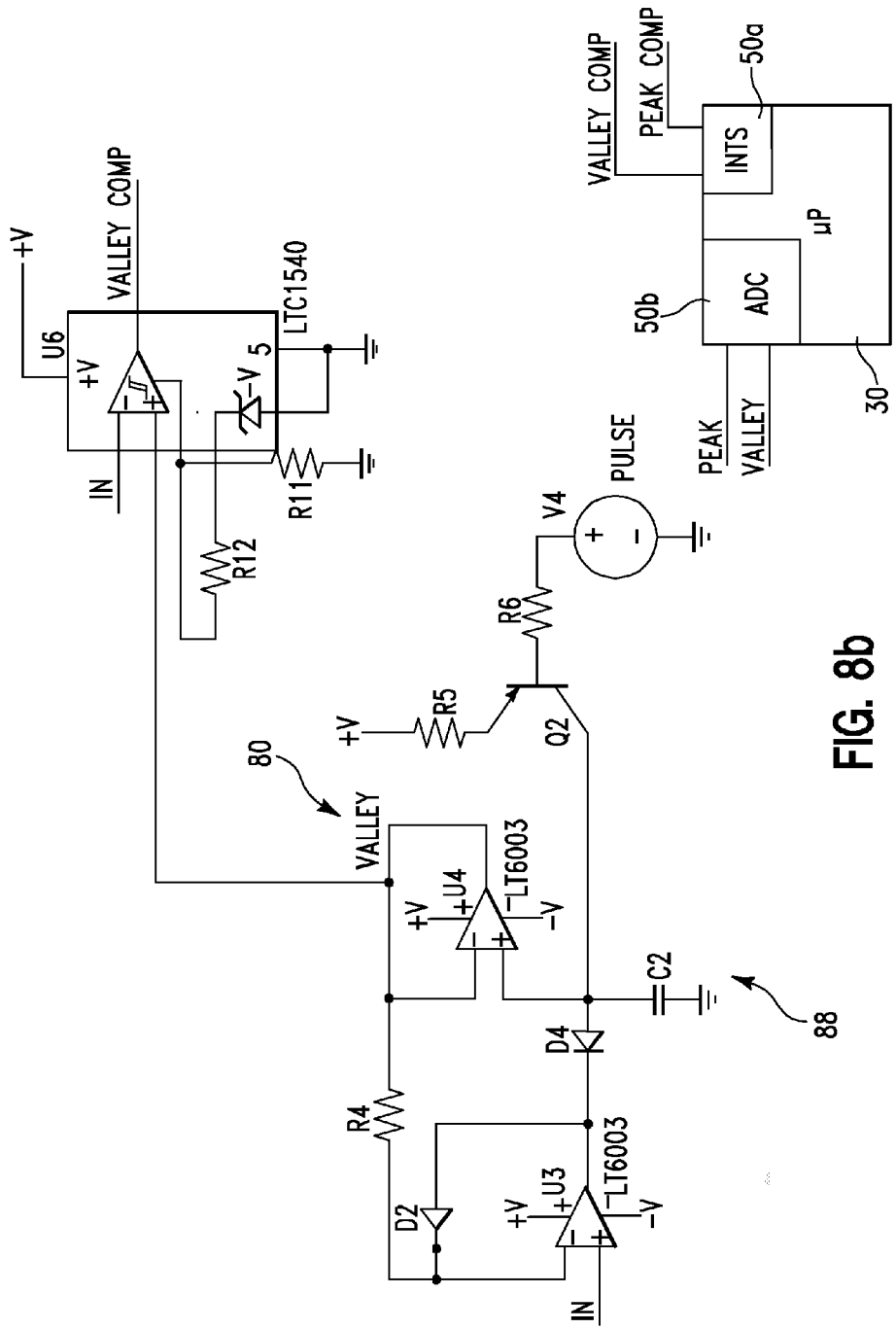

In one experiment a circuit as shown in FIG. 8 was built and tested. In this schematic voltage source V3 simulates the voltage IN provided by piezoelectric sensor 83 which in this experiment was assumed to provide a sinusoidal signal. Voltage source V3 provides the voltage labeled IN coupled into op amp based peak detection circuit 80 that includes op amps U1 and U2, as shown in the schematic of FIG. 8.

The output of this op amp based peak detection circuit, labeled PEAK in the schematic is fed to comparator U5. When PEAK is greater than input signal IN from piezoelectric sensor 83 and the difference between PEAK and IN is greater than a pre-specified fixed amount, output PEAKCOMP of comparator U5 changes state indicating that a peak was detected, as shown in FIGS. 6 and 7. This state change is used to "wake up" sleeping microprocessor 86. Once awake, microprocessor 86 samples the voltage on the PEAK line and stores the value as a detected peak.

On the right hand side of the schematic of FIG. 8 a similar circuit is provided that detects valleys. In this case output VALLEYCOMP from comparator U6 is used to awaken the microprocessor to sample the voltage on the VALLEY line and store its value as the detected valley voltage.

Once a peak or valley is detected, the peak or valley detector is reset by the microprocessor by applying a pulse to the base of the transistor Q1 (Peak) or Q2 (valley). Turning on transistor Q1 allows the voltage on C1 to discharge through R1, and Q1, and that causes the voltage on PEAK to discharge through R2, D1, D3, R1, and Q1. Similarly turning on Q2 allows the voltage on C2 to discharge through Q2 and R5, and that causes allows the negative voltage on VALLEY to discharge through R4, D2, D4, Q2, and R5.

Peak and valley indicator circuits 80, 88 provide digital signals PEAKCOMP and VALLEYCOMP that drive separate interrupt lines on microprocessor 86. Each interrupt wakes microprocessor 86 from an extremely low power sleep mode state. Having a separate interrupt line for the peak and the valley interrupts facilitates discrimination of peaks from valleys which facilitates rainflow analysis of the data.

By only waking microprocessor 86 to sample the one data point when each peak is reached and the one data point when each valley is reached while avoiding waking processor 86 to record data at other points in between, a tremendous amount of power is saved as compared with sampling at a high data rate and analyzing the stored data to detect the peaks and valleys. The power savings is proportional to the ratio of the expected number of peaks per second to the sample rate that would otherwise be required to collect data without a peak detection circuit, such as the one shown in FIG. 8.

Since op amps U1, U2, U3, and U4 each draw less than one microamp of current and since comparator U5 and U6 also draw less than one microamp, since Q1 and Q2 are both off except to clear PEAK and VALLEY for a short time, and since IN is provided by piezoelectric sensor 83, entire circuit 80, 88 draws little power.

Current for peak and valley detector circuit 80, 88 of FIG. 8 is less than 4 microamps. Because power is generated by piezoelectric sensor 83, and no power is consumed for activating piezoelectric sensor 83 for its measurements, circuit 80, 88 allows continuous detection of the dynamic waveform provided by piezoelectric sensor 83, and it is not bandwidth limited. The present applicants found that power consumption is approximately 75 times less than if a static strain gauge sampled at 500 Hz and detected the peaks and valleys from the wave forms using firmware. Because the embodiment consumes no power for continuously tracking piezoelectric sensor 83 and because microprocessor 86 samples only once for each peak and each valley, an ultra low power tag 28 is enabled that can perform embedded rainflow analysis on an individual component.

The combination of a self-generating piezoelectric patch along with nano-power operational amplifiers and comparators provides for a system that accurately tracks dynamic strains with a total system power consumption that is lower than 5 microamps.

While this work focused mainly on piezoelectric strain sensors, the circuit will work with any sensor that produces an analog voltage output. Those that are self-generating could be substituted to achieve that portion of the energy savings. Thus, it's benefits are most realized when used with a sensor that is extremely low power, zero power, or self-generating. The peak detection circuit would also be effective to provide energy savings with any sensor that generates a relatively high output voltage (>100 mV) even if it requires power to operate, such as thin film or semiconductor strain gauges. For example, it can be used to determine maximum and minimum values of output voltage from a wide range of sensors that provide a voltage output, including conventional strain gauges, torque cells, load cells, accelerometers, magnetometers, and pressure transducers. Voltage output can vary continuously or have a pulsed voltage shape.

For example using the circuit with a load cell allows detecting the maximum load measured on a bridge. If a car goes over the bridge a peak load provided by the car can be measured, allowing the weight of the car and the load on the bridge to be recorded. If a truck then goes over the bridge another peak load provided by the truck can be measured, allowing the weight of the truck and the loading on the bridge to be recorded. The set of peak loads determined over time as vehicles pass over the bridge is then used to determine the remaining lifetime of the bridge or to schedule inspection to determine whether cracks are developing.

The techniques for achieving low power consumption also enable the use of small, low profile, energy harvesters as the primary power source. They also enable batteries to be used where such low power is drawn that the battery provides power for almost as many hours as the battery's normal shelf life.

The present applicants also provided an embodiment that includes a regular resistive strain gauge in combination with the piezoelectric strain gauges. The resistive strain gauges provide the static load that escapes detection by the piezoelectric strain gauges. However, unlike the piezoelectric strain gauges, resistive strain gauges do not generate their own voltages when subjected to strain. When a current from an external power supply is applied the magnitude of the voltage drop measured across the resistive strain gauges is proportional to the strain experienced by the part to which they are attached. Thus, resistive strain gauges consume energy. In one embodiment, resistive strain gauges are configured in a Wheatstone Bridge arrangement to minimize temperature effects.

The present applicants recognized that data from the piezoelectric strain gauges could also be used to set the timing for operation of the resistive strain gauges so they are also only drawing current and consuming power just when most needed. For example, the resistive strain gauges may be set to provide a measurement at each peak as determined by the piezoelectric strain gauges. When the microprocessor is "woken up" by the digital interrupt signal, signifying a peak or valley, it would command sampling of the DC sensor by turning on provision of power to the circuitry for sampling the resistive strain gauges. It would then wait for the circuitry to settle and sample the output of the DC sensor and circuitry and record the value. Then the microprocessor would turn off the circuitry, go back to sleep mode, and wait until the next interrupt occurs. Circuitry for sampling the resistive strain gauges is shown in the '777 application, incorporated herein by reference.

Structures that could be instrumented with strain/load/moment measurement sensors and that use the peak/valley detection circuits to save power include: engine drive shafts, gearbox shafts, spinning gears, generator shafts, rotating wind turbine blades, rotating helicopter blades, rotating helicopter structural components, sporting equipment (bats, clubs, racquets), Handheld tools (such torque wrenches), instrumented bolts, car/truck/aircraft tires, car/truck/aircraft wheels, earth moving equipment, mining machines, milling machines and rotating cutters used for cutting metals/wood/plastics/ceramics, aircraft landing gear, aircraft structural bolts and shear pins, drill string in oil exploration, oil rig platforms, pipelines (on land and undersea), moving platforms/conveyances for mass production, implanted medical devices, such as cardiac stents (with pressure sensors), orthopedic implants with embedded strain/load/moment sensors, and wearable sensors such as knee braces and accelerometers to monitor human/animal range of motion and/or levels of activity.

For example, a torque wrench, weigh scale, or smart suspension that includes the strain/load/moment measurement sensors and that use the peak detection circuit could have an output that provides the peak torque, weight, or force measurement. Providing this output to the non-volatile display would make a self powered torque wrench, weigh scale or suspension.

While the disclosed methods and systems have been shown and described in connection with illustrated embodiments, various changes may be made therein without departing from the spirit and scope of the invention as defined in the appended claims.

The invention claimed is:

1. A system, comprising
a component, wherein said component further includes an energy harvesting mechanism,
an electronic circuit, and
a display,
wherein said electronic circuit and said display are mounted to said component,
wherein said electronic circuit is connected to receive data related to use of said component, and
wherein said electronic circuit is connected to said display for providing a time parameter related to at least one from the group consisting of remaining life of said component and life expended by said component,
wherein said time parameter is for displaying on said display,
wherein said component further includes a memory for recording an amount of energy harvested,
wherein said electronic circuit uses said amount of energy harvested data from said memory to determine said time parameter related to use of said component.

2. A system as recited in claim 1, wherein said data related to use of said component includes data related to at least one from the group consisting of severity of use and time of use.

3. A system as recited in claim 1, wherein said time parameter includes time said component was used.

4. A system as recited in claim 1, wherein said time parameter includes time said component was operated outside of a specification.

5. A system as recited in claim 1, wherein said component further includes a real time clock, wherein said real time clock is connected to said circuit for providing said time parameter.

6. A system as recited in claim 1, wherein said circuit uses data from said real time clock to provide information for display on said display related to a last date information displayed on said display was last updated.

7. A system as recited in claim 1, wherein said component further includes a sensor, wherein said electronic circuit is connected to receive said data related to use of said component as determined by said sensor.

8. A system as recited in claim 7, further comprising a sensor that provides information related to severity of use.

9. A system as recited in claim 7, wherein said sensor includes at least one from the group consisting of a strain gauge, humidity sensor, temperature sensor, load sensor, and torque sensor.

10. A system as recited in claim 7, wherein said strain gauge includes at least one from the group consisting of resistive, piezoelectric, piezoresistive, capacitive and inductive.

11. A system as recited in claim 10, wherein said component includes a first strain gauge and a second strain gauge, wherein said first strain gauge is for determining static strain and wherein said second strain gauge is for determining dynamic strain.

12. A system as recited in claim 11, wherein said first strain gauge includes a resistive strain gauge and wherein said second strain gauge includes a piezoelectric strain gauge.

13. A system as recited in claim 10, wherein said sensor provides said information related to severity of use based on amount of energy generated by said sensor.

14. A system as recited in claim 1, wherein said component further includes a communications device, wherein said electronic circuit is connected to receive said data related to use of said component from said communications device.

15. A system as recited in claim 14, wherein said communications device includes a wireless communications device.

16. A system as recited in claim 1, wherein said electronic circuit includes a logic circuit.

17. A system as recited in claim 16, wherein said logic circuit includes a processor.

18. A system as recited in claim 1, wherein said energy harvesting mechanism includes at least one from the group consisting of a piezoelectric element, a solar cell, a dynamo and a thermoelectric generator.

19. A system as recited in claim 1, wherein energy derived from said energy harvesting mechanism is used for powering said electronic circuit and changing information displayed on said display.

20. A system as recited in claim 1, wherein energy derived from said energy harvesting is used for sensing operation of said component.

21. A system as recited in claim 20, wherein said energy harvesting is tuned to a frequency typical of said component.

22. A system as recited in claim 1, further including an energy storage device, wherein said energy harvesting mechanism is connected to provide harvested energy to said energy storage device for storing said energy.

23. A system as recited in claim 1, wherein said display requires no energy for displaying information previously written.

24. A system as recited in claim 1, wherein said display includes an electronic ink display.

25. A system as recited in claim 1, wherein said component further includes an energy storage device.

26. A method of displaying information, comprising:
a. providing a component, said component including an energy harvesting mechanism and a memory, wherein said memory is for recording an amount of energy harvested;
b. providing an electronic circuit and a display on said component;
c. providing data related to use of said component to said electronic circuit, wherein said electronic circuit uses said amount of energy harvested data from said memory to determine said time parameter related to use of said component;
d. providing output from said electronic circuit to said display for displaying a time parameter related to at least one from the group consisting of remaining life of said component and life expended by said component; and
e. displaying said time parameter on said display.

27. A method as recited in claim 26, wherein said data related to use includes at least one from the group consisting of time used, expended life, remaining life, and severity of use.

28. A system as recited in claim 26, wherein said time parameter includes time said component was used.

29. A system as recited in claim 26, wherein said time parameter includes time said component was operated outside of a specification.

30. A method as recited in claim 26, further comprising displaying at least one from the group consisting of maximum severity of use, and range of severity.

31. A method as recited in claim 26, further comprising displaying at least one from the group consisting of condition and present health of said component.

32. A method as recited in claim 26, further comprising providing a sensor and a real time clock on said component, and providing time stamped use related data from said sensor to said electronic circuit for displaying on said display.

33. A method as recited in claim 32, wherein said sensor includes at least one from the group consisting of a strain gauge, humidity sensor, temperature sensor, load sensor, and torque sensor.

34. A method as recited in claim 26, further comprising providing a receiving circuit on said component, and using said receiving circuit to receive data regarding component use from an external source.

35. A method as recited in claim 26, wherein said visual display includes a non-volatile display.

36. A method as recited in claim 35, wherein said non-volatile display includes electronic ink.

37. A method of displaying information about a component, comprising:
a. providing the component, wherein the component includes a radio receiver, an energy harvesting device, a non-volatile display, and a memory for recording an amount of energy harvested, wherein said electronic circuit uses said amount of energy harvested data from said memory to determine said time parameter related to use of said component;
b. receiving energy from an external source of energy with said energy harvesting device for receiving all power for powering said radio receiver and said non-volatile display;
c. providing a data base external to said component;
d. using said radio receiver to receive data from said data base; and
e. providing information based on said received data for displaying on said non-volatile display.

38. A method as recited in claim 37, wherein said data is related to use of said component.

39. A method as recited in claim 38, wherein said information related to use of said component includes information related to component health.

40. A method as recited in claim 38, wherein said information related to use of said component includes information related to at least one from the group consisting of hours used and remaining life.

41. A method as recited in claim 40, wherein said information related hours to used includes flight hours.

42. A method as recited in claim 37, further comprising providing information to said display related to a last date information displayed on said display was last updated.

43. A method as recited in claim 37, wherein said energy harvesting device harvests radio frequency energy from an external source of radio frequency radiation.

44. A method as recited in claim 37, wherein said energy harvesting device harvests energy from at least one from the group consisting of strain, vibration, light, and thermal.

45. A method as recited in claim 37, wherein said component further comprises a transmitter.

46. A system, comprising
a component including an energy harvesting mechanism, a memory and a real-time clock;
an electronic circuit mounted to said component and is in electronic communication with said component;
a display mounted to said component and is in electronic communication with said component and in electronic communication with said electronic circuit;
wherein said electronic circuit electronic communication with said component includes receiving data related to use of said component;

wherein said display electronic communication with said electronic circuit is includes providing a time parameter related to at least one from the group consisting of remaining life of said component and life expended by said component;

wherein said time parameter is capable of being displayed on said display;

wherein said memory is capable of recording an amount of energy harvested;

wherein said electronic circuit is capable of using said amount of energy harvested data to determine said time parameter related to use of said component; and wherein a real time clock, wherein said real time clock is connected to said electronic circuit for providing said time parameter.

* * * * *